United States Patent [19]

Harrison, Jr.

[11] 4,185,247

[45] Jan. 22, 1980

[54] MEANS FOR REDUCING SPURIOUS FREQUENCIES IN A DIRECT FREQUENCY SYNTHESIZER

[75] Inventor: Earnest R. Harrison, Jr., Crownsville, Md.

[73] Assignee: The United States of America as represented by the Secretary of the Air Force, Washington, D.C.

[21] Appl. No.: 866,743

[22] Filed: Jan. 3, 1978

[51] Int. Cl.² .................................................. H03K 13/32
[52] U.S. Cl. ........................................... 328/165; 328/14
[58] Field of Search ............................ 328/14, 155, 165

[56] References Cited

U.S. PATENT DOCUMENTS

| | | | |
|---|---|---|---|
| 3,882,403 | 5/1975 | Gerken | 328/14 |
| 3,973,209 | 8/1976 | Nossen et al. | 328/14 |
| 3,976,945 | 8/1976 | Cox | 328/14 |
| 4,011,516 | 3/1977 | Heimbigner et al. | 328/14 |

*Primary Examiner*—John S. Heyman

*Attorney, Agent, or Firm*—Joseph E. Rusz; George Fine

[57] ABSTRACT

Spurious frequencies are eliminated in a direct frequency synthesizer by means of a feed forward correction circuit. The improved direct frequency synthesizer of the invention includes a series adder, clocked register, a D/A converter and a phase corrector. The adder is inputted by a digital control increment and the output of the register. The system clock frequency is divided down by a smoothing counter that in part controls the phase of the output signal. Spurious frequencies are manifested by overflow of the register. The register overflow is converted to an analog signal by the D/A converter. The system output is provided by a voltage controlled oscillator that is controlled by an amplifier which is responsive to both the smoothing counter output and the analog output of the D/A converter. Additionally, the D/A converter is sampled twice for every cycle of output frequency, resulting in a doubling of the output frequency for a given D/A converter.

2 Claims, 4 Drawing Figures

MEANS FOR REDUCING SPURIOUS FREQUENCIES IN A DIRECT FREQUENCY SYNTHESIZER

STATEMENT OF GOVERNMENT INTEREST

The invention described herein may be manufactured and used by or for the Government for governmental purposes without the payment of any royalty thereon.

BACKGROUND OF THE INVENTION

Frequency synthesizers generally fall into two groups: indirect and direct. The indirect synthesizer is characterized by good spurious suppression but relatively slow switching speed. Direct synthesis techniques usually yield rapid frequency switching but poorer spurious rejection.

One of the phase accumulators of prior art consists of a register whose contents are incremented by a fixed amount every clock cycle. Thus the register contents increase continuously until it overflows and the process is repeated. The rate of this repetition is proportional to the product of the clock frequency and the amount the register is incremented each clock cycle. The output of the register is fed to a sine look-up table to generate a digital sine wave which is then converted to analog by a D/A converter.

Generally, the accumulator in this type synthesizer is wider, or has more bits, than the sine look-up table and D/A converter. When this is true it can be shown that the worst case spurious frequency will be 6 db below the carrier for every bit in the sine look-up table address. Thus for a 10-bit wide address the worst case spurious will be 60 db down. (Note that in this case the D/A converter needs only nine bits of resolution).

The phase accumulator just described is an excellent low frequency synthesizer producing a good sine wave right down to D.C. It has the disadvantage that the D/A must be sampled every clock period thus limiting the maximum frequency that can be generated to a fourth or so of the maximum frequency at which D/A can be sampled. This problem is compounded as more and more bits are added to the D/A to reduce spurs since each additional bit generally means that the D/A takes longer to settle.

The method and apparatus disclosed here, called a feed-forward phase corrector takes some of the load off of the D/A converter thus allowing the output frequency to be pushed upward until limited by the logic speed. Also spurious rejection is obtained without increasing the D/A resolution.

SUMMARY OF THE INVENTION

A direct frequency synthesizer is provided. There is included a series adder, a clocked register, a digital to analog (D/A) converter and phase corrector. The adder receives as inputs a digital control increment and the output of the register. The clock frequency is divided down by a smoothing counter that controls the phase of the output signal in the phase corrector. Additionally, the D/A converter is sampled twice for every cycle of output frequency, resulting in a doubling of the output frequency.

DESCRIPTION OF THE PREFERRED EMBODIMENT

Figure 1:
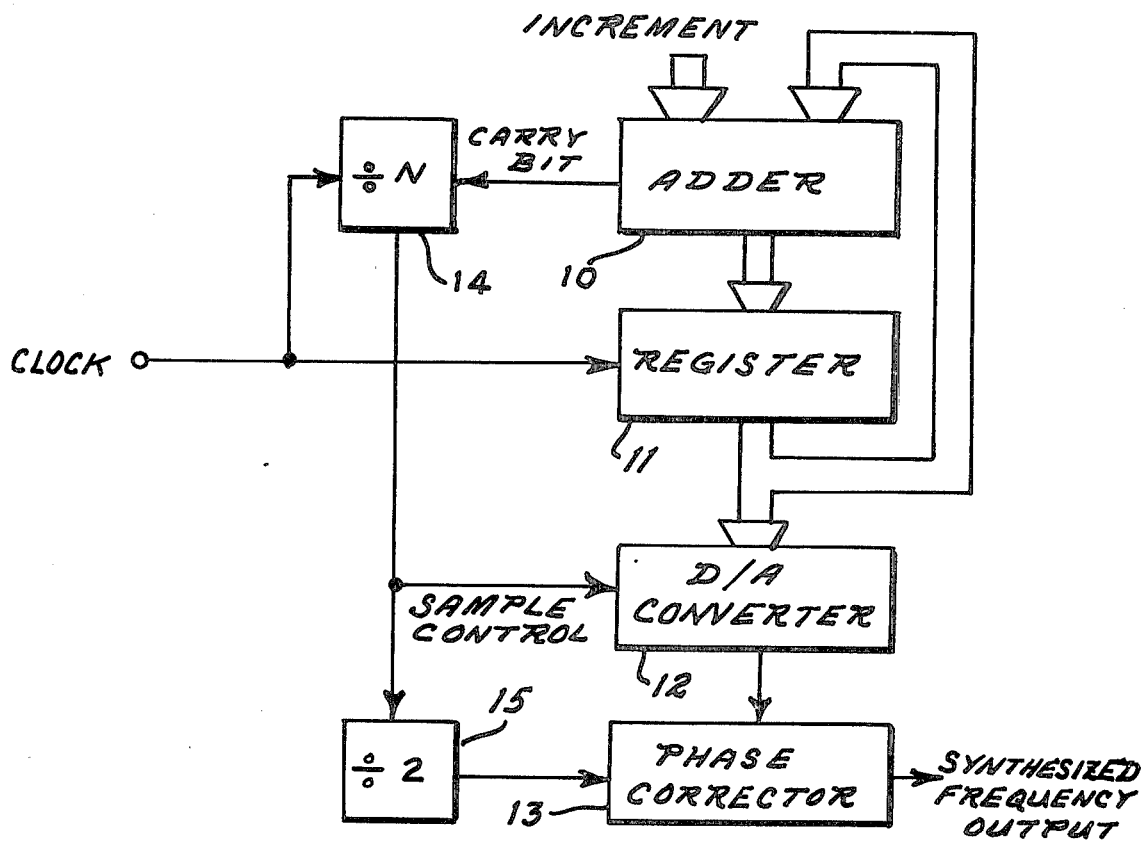
FIG. 1 shows in block diagram form a preferred embodiment of the direct frequency synthesizer.

Now referring in detail to FIG. 1, there is shown adder 10 inputted by a digital control increment and the output of the register 11. Register 11 receives input from adder 10 and a clock signal from terminal 16. Divider 14, dividing by N, receives an input from clock terminal 16 and also from adder 10. The divided signal therefrom simultaneously is fed to D/A converter 12 as a sample control and also to divider 15 which divides by two. D/A converter 12 also receives an input from register 11 and provides an input to phase corrector 13. Phase corrector 13 simultaneously receives an input from divider 15. The output from phase corrector 13 is a synthesized frequency output. The apparatus in FIG. 1 may also be referred to as a feed forward phase compensation synthesizer.

In this invention shown in FIG. 1 the sine look-up table is eliminated while a divide by N smoothing counter and phase correction are added. Additionally the D/A converter 12 is sampled twice for every cycle of the output frequency. Thus a 2:1 reduction in D/A converter speed for a given output frequency is provided. The spurious level will be less than that for the prior art synthesizer. In fact the spurious level is given by: $S_{dBc} = -20 \log 2N - 6 \cdot K$ where K is the number of bits in the D/A converter. Thus, the degree of spurious rejection required can be apportioned between the smoothing counter and D/A converter 12 to minimize system costs.

Figure 2A:
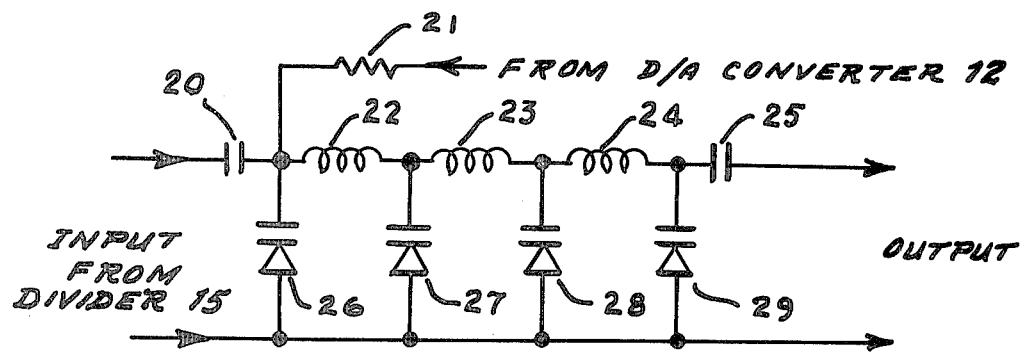
FIGS. 2A and 2B show two basic forms of phase correctors for use in the embodiment of FIG. 1.
Figure 2B:
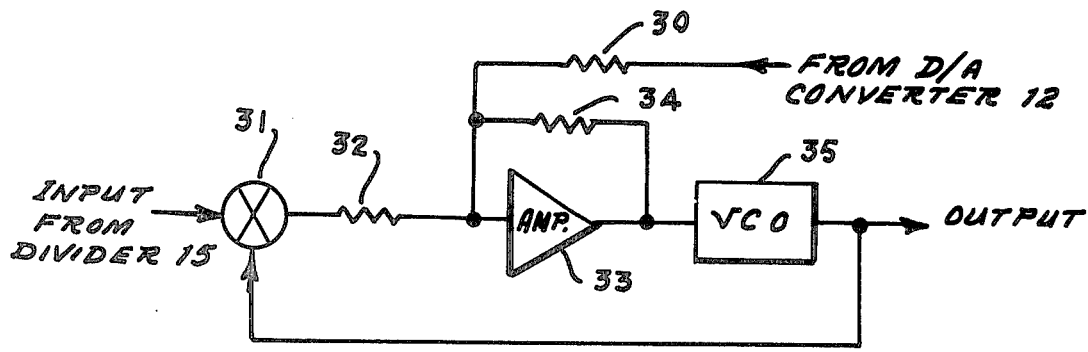

The phase corrector in this invention takes two basic forms shown in FIGS. 2A and 2B. The synthesizer using the apparatus shown in FIG. 2B and its operation is described below.

Figure 3:
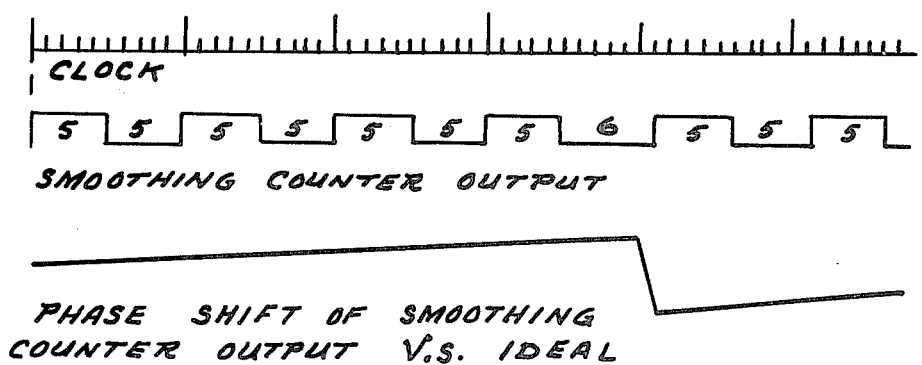
FIG. 3 illustrates a timing diagram of phase accumulator showing how spurious frequencies are generated with the last waveform also representing residue buildup in the accumulator after each overflow.

The timing diagram shown in FIG. 3 shows a typical output of the smoothing counter. Note that generally there are P clock cycles per period but every so often there is a period with P−1 (or P+1) clock cycles. This is true when the clock frequency is not evenly divisible by the output frequency. The phase variation of the output frequency is a form of sawtooth as shown in FIG. 3. If this phase variation can be removed in some way the spurious frequencies generated in the phase accumulator would be eliminated.

The phase variation shown in FIG. 3 is reproduced in the overflow pattern of the phase accumulator. That is the smoothing counter increments each time the accumulator overflows. Eventually the residue in the accumulator after each overflow builds up and an overflow occurs one clock cycle sooner (later). This residue is the information sampled by the D/A converter and is used in a feed-forward manner to correct the phase variations in the output waveform. The correction may be accomplished by shifting the phase of the output waveform with a variable delay line or with a phase shifter. In the implementation that uses the phase locked loop the D/A output is used to cancel that portion of the phase detector output that is due to the spurious phase shifts thus removing them from the output signal.

A synthesizer was constructed using the methods described above and its output spectrum was measured with and without the feed-forward phase compensation. An 8-bit D/A converter was used for these tests and an oscillograph shows 45 dB improvement in spur rejection was obtained vs. a theoretical 48 dB.

The synthesizer just described operates with a clock of 24 MHz to obtain an output frequency of 4 MHz. Using the same logic family (Schottky and low power Schottky TTL) it should be possible to build a synthesizer at 60 KHz with 112 dB of spurious frequency rejection using a 10-bit D/A converter. The prior art phase accumulator would require a 17-bit D/A and about $10^6$ bits of ROM for the sine look-up table to achieve the same performance. Clearly for such low frequency synthesizers the feed-forward phase corrector has much to offer.

Again referring to FIGS. 2A and 2B. Either one may be used in place of phase corrector 13 of FIG. 1. FIG. 2A operates as a delay line and includes input resistor 21 and input capacitor 20, inductors 22, 23, 24, units 26 through 29 and output capacitor 25. FIG. 2B operates as a PLL (phase locked loop) and includes input resistor 30, component 31, resistor 32, amplifier 33, resistor 34 across amplifier 33, voltage controlled oscillator 35 which provides the output and also feeds a signal back to 31.

One of the advantages of this invention over the prior art is that the low cost and simplicity of phase accumulator synthesizers is retained. Another feature is that for a given D/A converter the frequency range is doubled. Yet another feature is that spurious frequencies can be reduced making the accumulator run faster, increasing the smoothing counter correspondingly and providing concommitant improvement in spurious rejection. Still another feature is that the smoothing counter need not be a power of two. This allows one to more fully use the logic speed in reducing spurs and can simplify system design through greater flexibility. Finally, D/A converter glitches are less of a consequence in the feed-forward correction scheme than in the phase accumulator method.

What is claimed is:

1. In a direct frequency synthesizer having a system clock, an adder, a register and a divider, the divider and the register being fed by the system clock and said adder, and the adder being fed by a digital control increment and said register, the improvement residing in a spurious frequency rejection circuit, said spurious frequency rejection circuit comprising
   a digital to analog converter,
   a summing means,
   an amplifier, and
   a voltage controlled oscillator, said voltage controlled oscillator having an output and being controlled by said amplifier, the output of said voltage controlled oscillator being summed within the output of said divider by said summing means, said amplifier being connected to receive and being responsive to the summed output of said summing means and the output of said digital to analog converter.

2. A spurious frequency rejection circuit as defined in claim 1 including a second divider for dividing by 2 the summing means input from the frequency synthesizer divider.

* * * * *